United States Patent
Hutchins et al.

(10) Patent No.: US 9,692,358 B2
(45) Date of Patent: Jun. 27, 2017

(54) CIRCUITRY

(71) Applicant: Hilight Semiconductor Limited, Hampshire (GB)

(72) Inventors: Derek John Hutchins, Ringwood Hants (GB); Patrick Etienne Richard, Thouare-sur-Loire (FR)

(73) Assignee: HILIGHT SEMICONDUCTOR LIMITED, Hampshire (GB)

( * ) Notice: Subject to any disclaimer, the term of this patent is extended or adjusted under 35 U.S.C. 154(b) by 0 days.

(21) Appl. No.: 14/719,647

(22) Filed: May 22, 2015

(65) Prior Publication Data

US 2015/0340993 A1    Nov. 26, 2015

(30) Foreign Application Priority Data

May 23, 2014    (GB) .................................. 1409231.6

(51) Int. Cl.
| | | |
|---|---|---|
| H03F 3/08 | (2006.01) | |
| H03F 1/02 | (2006.01) | |
| H03F 3/45 | (2006.01) | |
| H03F 1/08 | (2006.01) | |
| H04B 10/69 | (2013.01) | |
| H03F 1/52 | (2006.01) | |

(52) U.S. Cl.
CPC ............. *H03F 1/0205* (2013.01); *H03F 1/08* (2013.01); *H03F 1/523* (2013.01); *H03F 3/082* (2013.01); *H03F 3/087* (2013.01); *H03F 3/45076* (2013.01); *H04B 10/693* (2013.01); *H03F 2200/444* (2013.01); *H03F 2203/45116* (2013.01); *H03F 2203/45336* (2013.01)

(58) Field of Classification Search
CPC ........................................................ H03F 3/08
USPC ....................................... 330/308; 250/214 A
See application file for complete search history.

(56) References Cited

U.S. PATENT DOCUMENTS

| | | | |
|---|---|---|---|
| 6,204,980 B1 | 3/2001 | Momtaz et al. | |
| 6,246,282 B1 * | 6/2001 | Oono ..................... | H03F 3/087 250/214 A |
| 6,246,284 B1 * | 6/2001 | Nemoto ................. | H03F 3/087 250/214 A |
| 6,593,810 B2 * | 7/2003 | Yoon ..................... | H03F 3/087 250/214 A |
| 6,624,405 B1 | 9/2003 | Lau et al. | |
| 7,088,181 B1 | 8/2006 | Voo | |
| 7,262,655 B2 * | 8/2007 | Mijuskovic .............. | H03F 3/08 330/282 |

(Continued)

FOREIGN PATENT DOCUMENTS

| | | |
|---|---|---|
| EP | 0 654 896 | 5/1995 |
| EP | 0 664 604 | 7/1995 |

(Continued)

OTHER PUBLICATIONS

GB IP Office, Search Report Claims 1-20, GB1409231.6, Oct. 27, 2014.
GB IP Office, Search Report Claims 21-25, GB1409231.6, Jan. 26, 2015.

*Primary Examiner* — Henry Choe
(74) *Attorney, Agent, or Firm* — Leveque IP Law, P.C.

(57) ABSTRACT

Trans-impedance amplifier circuitry having an amplifier; a feedback resistor arranged between an output of the amplifier and an input of the amplifier; and at least one further resistor arranged physically parallel to the feedback resistor.

13 Claims, 15 Drawing Sheets

(56) References Cited

U.S. PATENT DOCUMENTS

| | | | | |
|---|---|---|---|---|
| 7,330,668 | B2* | 2/2008 | Heimlicher | H03F 1/26 250/214 A |
| 7,598,479 | B2* | 10/2009 | Nogami | H03F 3/08 250/214 A |
| 7,616,062 | B2* | 11/2009 | Miyamoto | H03F 3/08 250/214 A |
| 8,179,200 | B2* | 5/2012 | Jahana | H03F 1/34 330/109 |
| 8,400,223 | B2* | 3/2013 | Karthaus | H03F 1/302 330/285 |
| 2003/0193704 | A1 | 10/2003 | Miremadi | |
| 2004/0145419 | A1* | 7/2004 | Nogami | H03F 3/087 330/308 |
| 2006/0045531 | A1 | 3/2006 | Killmeyer et al. | |
| 2006/0202753 | A1 | 9/2006 | Ferianz et al. | |
| 2006/0244526 | A1 | 11/2006 | Mijuskovic | |

FOREIGN PATENT DOCUMENTS

| | | |
|---|---|---|
| EP | 0 909 021 | 4/1999 |
| EP | 1 947 544 | 7/2008 |
| EP | 2 434 642 | 3/2012 |
| GB | 2 149 582 | 6/1985 |
| GB | 2 424 330 | 9/2006 |
| WO | WO 96/13714 | 5/1996 |
| WO | WO 03/062866 | 7/2003 |
| WO | WO 2006/020612 | 2/2006 |
| WO | WO 2012/078169 | 6/2012 |

* cited by examiner

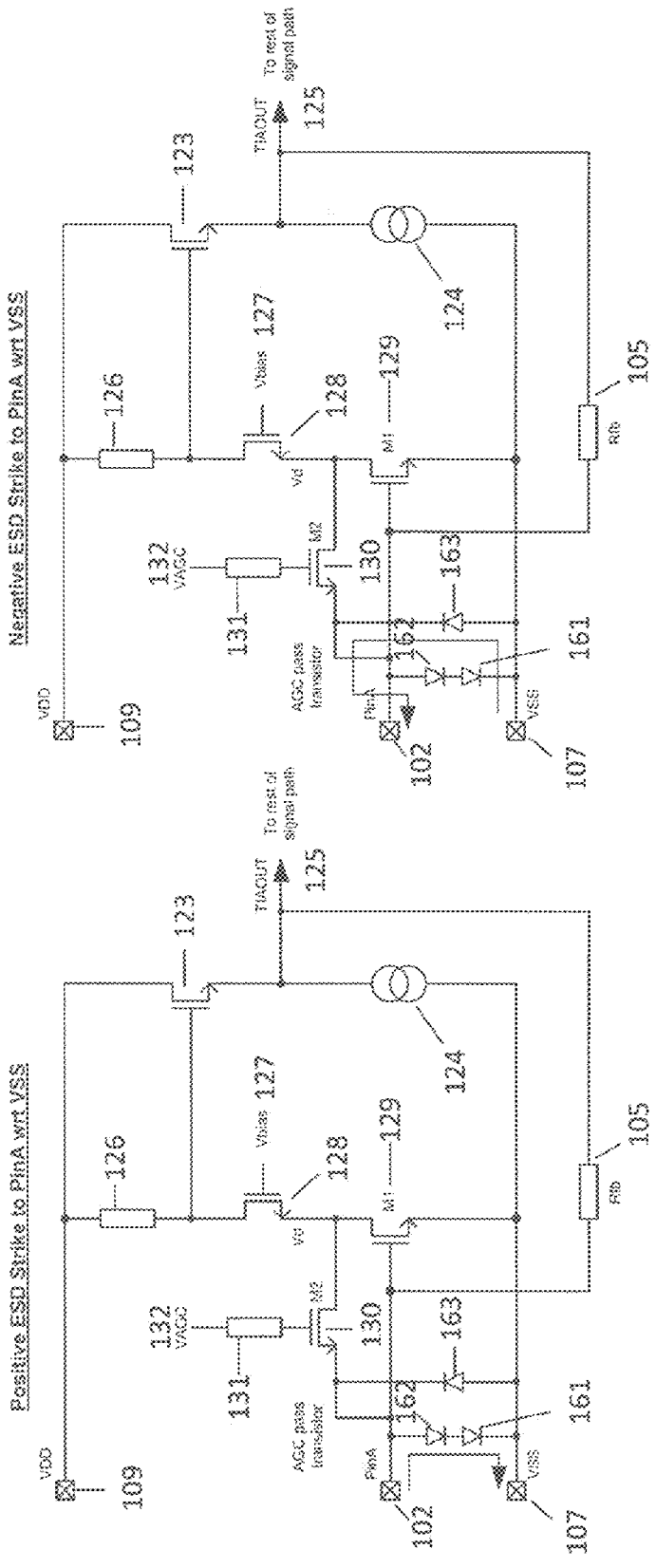

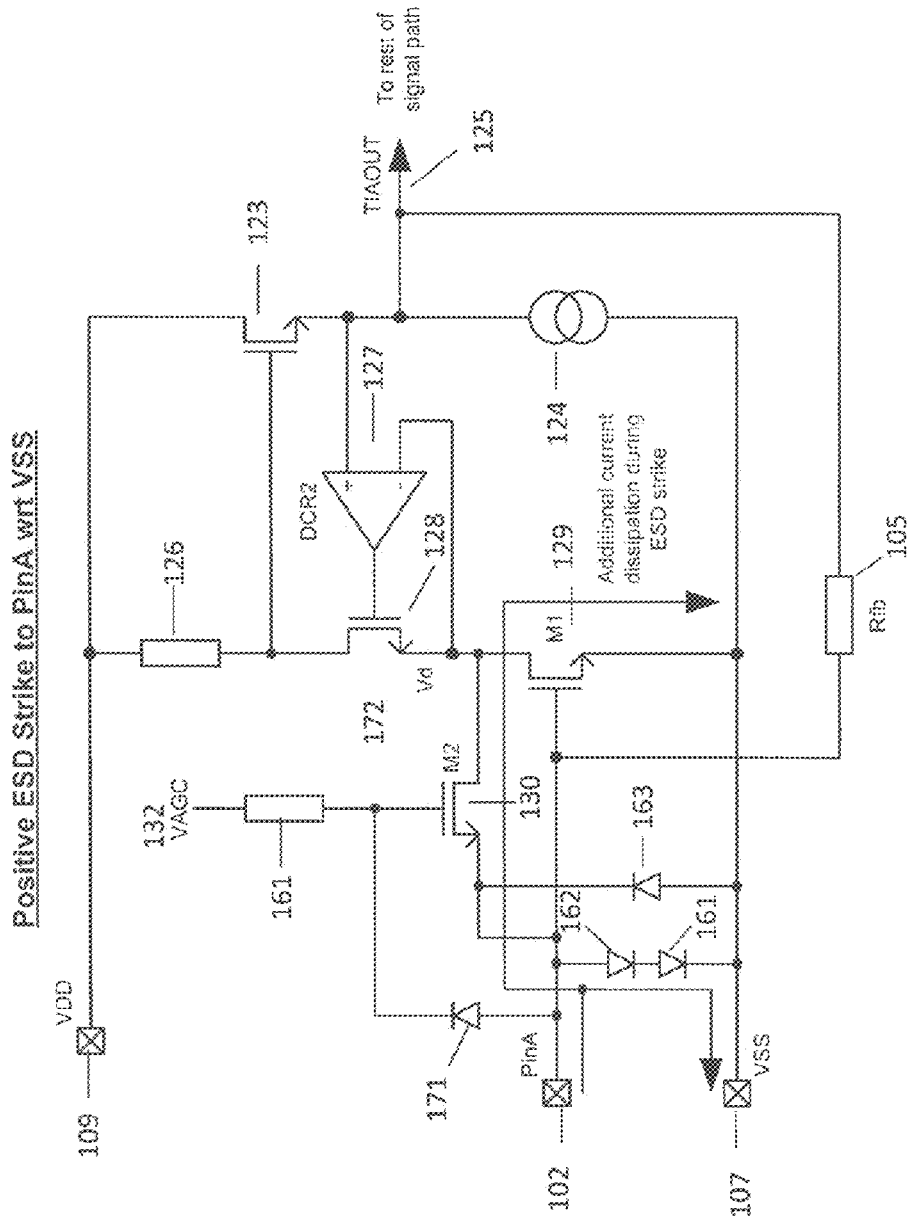

CIRCUITRY

FIELD OF THE INVENTION

Some embodiments relate to circuitry and in particular but not exclusively to trans-impedance amplifier (TIA) circuitry.

BACKGROUND OF THE INVENTION

A trans-impedance amplifier is arranged to convert a current to voltage. The gain of the trans-impedance amplifier is the ratio of the output voltage to the input current. The magnitude of the gain provided by the trans-impedance amplifier is controlled by a feedback resistor. Trans-impedance amplifiers are used in different applications such as for the conversion of a current generated by a photo detector into a voltage signal.

SUMMARY

According to a first aspect there is provided a trans-impedance amplifier circuitry comprising: an amplifier; a feedback resistor arranged between an output of the amplifier and an input of the amplifier; and at least one further resistor arranged physically parallel to the feedback resistor.

At least one of the feedback resistor and the at least one further resistor may be elongate.

At least one further resistor may comprise first and second further elongate resistors, parallel to said elongate feedback resistor, and on opposed sides of said elongate feedback resistor.

A longitudinal axis of the elongate feedback resistor may be parallel to a longitudinal axis of the at least one further elongate resistor.

The feedback resistor and the at least one further resistor may be provided in a same plane.

The same plane may be parallel to a substrate.

The elongate feedback resistor may be longer than said at least one further elongate resistor.

A height of at least one of said feedback resistor and said at least one further resistor may be greater than a respective width.

At least one of said feedback resistor and said at least one further resistor may be provided by polysilicon.

At least one of said feedback resistor and said at least one further resistor may be provided by two or more resistors.

The at least one further resistance may be coupled between an output of said amplifier and a voltage level.

The voltage level may be ground.

The circuitry may comprise a capacitance comprising at least two elements.

The capacitance may comprise at least two elongate elements.

A longitudinal axis of at least one of said feedback resistor and said at least one further resistor may be parallel to a longitudinal axis of said at least two elongate capacitor elements.

The capacitance may be provided in a first plane spaced apart from a second plane in which of at least one of said feedback resistor and said at least one further resistor is provided.

The first plane may be further from a substrate than said second plane.

The said capacitance may be provided in a metal layer.

The capacitance may comprise a first elongate element extending between two second elongate elements.

The elongate elements of said capacitor may be shorter than at least one of said feedback resistor and said at least one further resistor According to a second aspect there is provided: trans-impedance amplifier circuitry comprising: an amplifier; at least one elongate feedback resistor arranged between an output of the amplifier and an input of the amplifier; and a capacitor on the opposite side of said feedback resistor to a substrate, said capacitor comprises at least two elongate elements overlying said feedback resistor.

The capacitor may comprise a first elongate element at a first voltage arranged between first and second parallel elements at a second voltage.

An amount of overlap between said first elongate element and the first and second parallel elements may control said capacitance.

The capacitor may be configured to reduce the effective impedance of said feedback resistor at higher frequencies.

The capacitor may be provided in a metal layer.

An integrated circuit or die may comprise the circuitry.

According to a third aspect there is provided a trans-impedance amplifier circuitry comprising: an amplifier; a feedback resistor arranged between an output of the amplifier and a first input of the amplifier; a first voltage controlled current path configured to draw an input current from an input of said trans-impedance amplifier circuitry; and a second voltage controlled current path configured to match the current drawn in the first voltage controlled current path to provide an output current. The input of the trans-impedance amplifier may be coupled to a photodiode.

The photodiode may be an avalanche photodiode.

At least one of the first and second voltage controlled current paths may comprise a transistor.

The circuitry may comprise a first control loop configured to measure a first average voltage across the feedback resistor and configured to provide a control voltage to said first voltage controlled current path wherein said voltage controlled current path is controlled to minimise said first average voltage.

The first control loop may be further configured to provide said control voltage to said second voltage controlled current path.

The circuitry may comprise a second control loop configured to measure a second average voltage between the output of the amplifier and a second input of the amplifier and configured to provide a control voltage to a third voltage controlled current path between the second input of the amplifier and the voltage supply wherein said third voltage controlled current path is controlled to minimise said second average voltage.

The second input of the amplifier may be an automatic gain control input.

The third voltage controlled current path may be a transistor.

According to a forth aspect there is provided a package comprising: an trans-impedance amplifier integrated circuit; a photodiode coupled to an input of said trans-impedance amplifier; first and second output pins coupled to first and second outputs of said trans-impedance amplifier; a power supply pin coupled to a power supply connector of said trans-impedance amplifier; a ground pin coupled to at least one ground connector of said trans-impedance amplifier; a current measurement output pin coupled to a current measurement output of said trans-impedance amplifier; and a bias voltage pin coupled to said photodiode equidistant between the first and second output pins.

According to a fifth aspect there is provided a trans-impedance amplifier circuitry comprising: an amplifier; a feedback resistor arranged between an output of the amplifier and a first input of the amplifier; a first voltage controlled current path arranged between an input of said trans-impedance amplifier circuitry and a second input of the amplifier; and a rectifier arranged between the input of said trans-impedance amplifier circuitry and a voltage control input of said voltage first controlled current path.

The first input of the amplifier may be coupled to a photodiode.

The photodiode may be an avalanche photodiode.

The first voltage controlled current path may comprise a transistor.

The circuitry may comprise a control loop configured to measure an average voltage between the output of the amplifier and the second input of the amplifier and configured to provide a control voltage to a second voltage controlled current path wherein said second voltage controlled current path is controlled to minimise said average voltage.

The second voltage controlled current path may be a transistor.

The second input of the amplifier may be an automatic gain control input.

The first voltage controlled current path may be an automatic gain control transistor.

BRIEF DESCRIPTION OF FIGURES

For a better understanding of some embodiments, reference will be made by way of example only to the accompanying drawings in which:

FIG. 16A schematically shows a trans-impedance amplifier circuit undergoing positive electrostatic discharge strike;

FIG. 16B schematically shows a trans-impedance amplifier circuit undergoing negative electrostatic discharge strike; and FIG. 17 schematically shows a modified trans-impedance amplifier circuit undergoing positive electrostatic discharge strike.

DETAILED DESCRIPTION OF EMBODIMENTS

Figure 1:
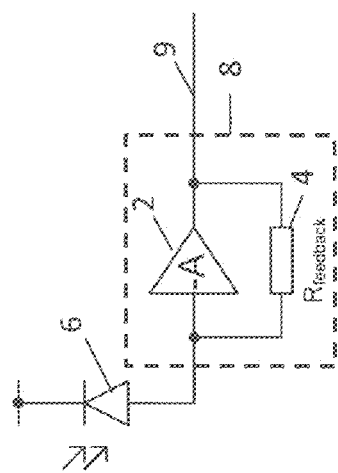
FIG. 1 schematically shows a trans-impedance amplifier circuit.

Reference is first made to FIG. 1 which shows trans-impedance circuitry. In FIG. 1, an amplifier 2 is shown with a feedback resistor $R_{feedback}$ 4. The amplifier may be an operational amplifier. The feedback resistor 4 is coupled between the output of the amplifier 2 and its input. The input of the amplifier 2 is also coupled to a photodiode 6. The current generated by the photodiode 6 is converted to a voltage by the trans-impedance amplifier circuitry and provided as an output 9.

As schematically indicated by the dotted line 8, the trans-impedance amplifier circuitry is arranged on a die or an integrated circuit. The photodiode may be provided externally to the die or integrated circuit 8. However in alternative embodiments, the photodiode 6 may be provided on the die or integrated circuit.

Figure 2:
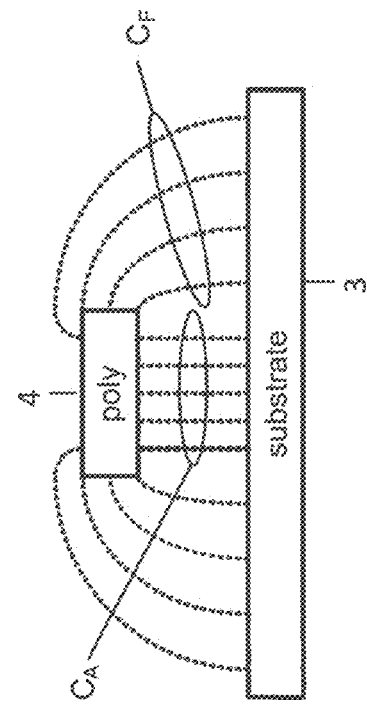
FIG. 2 schematically shows in cross-section the parasitic capacitance between the resistor of FIG. 1 and a substrate, for the arrangement of FIG. 1.

Generally, in some applications, the feedback resistor is made as high as possible in order to improve sensitivity performance. However, the maximum value of the feedback resistance 4 may be limited by parasitic capacitance. In this regard, reference is made to FIG. 2. As schematically shown in FIG. 2, the substrate of the die or integrated circuit is referenced 3. The feedback resistor is referenced 4. The feedback resistor may be implemented in the integrated circuit by polysilicon. The parasitic capacitance generated between the feedback resistor 4 and the substrate is made up of $C_A+C_F$ where $C_A$ is the capacitance between the area of the feedback resistor and the substrate 3 and $C_F$ is the fringing capacitance.

Figure 3:
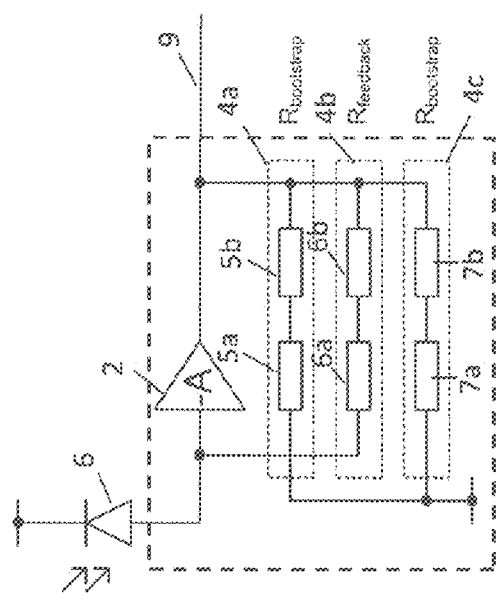
FIG. 3 shows a first embodiment of a trans-impedance amplifier circuit.

Reference is made to FIG. 3 which shows a first embodiment. The amplifier 2 receives an output from the photodiode 6 and provides a voltage output 9. In the arrangement shown in FIG. 3, the feedback resistor is referenced 4b and is arranged as described in relation to FIG. 1.

In some embodiments, the feedback resistor may be made up of two separate resistors, resistor 6a and 6b, arranged in series. In other embodiments the feedback resistor is made of a single resistor. In other embodiments, the feedback resistor 4a may be made up of more than two resistors.

A first boot strap resistor 4a is provided between the output of the trans-impedance amplifier and ground. A second boot strap resistor 4c is arranged in parallel with the first boot strap resistor 4a. Each of the boot strap resistors comprises two separate resistances, arranged in series. In the case of the first bootstrap resistor 4a, these resistances are referenced 5a and 5b. In the case of the second boot strapped resistance 4c, these resistances are referenced 7a and 7b.

It should be appreciated that in some embodiments, the bootstrap resistors may be provided by a single resistance and in other embodiments by more than two resistances.

In some embodiments, only one boot strap resistance is provided.

In some embodiments, further bootstrapping may be provided by driving parallel metal routing above the resistor and/or a driven isolated well below the resistor. The metal routing may further decrease Cf. The driven isolated well may reduce Ca.

Figure 4:
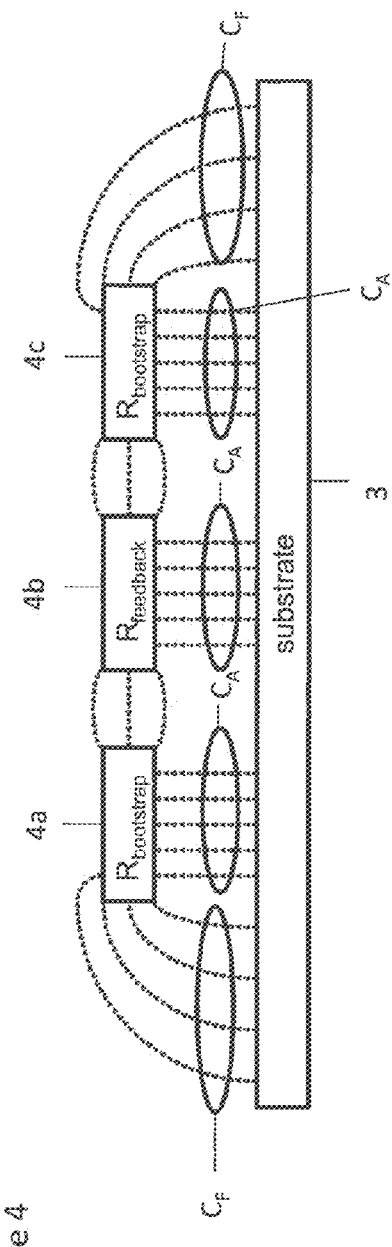
FIG. 4 schematically shows in cross-section the parasitic capacitance for the arrangement of FIG. 3.

Reference is now made to FIG. 4 which shows the layout of the arrangement of FIG. 3 on the integrated circuit or die. The substrate 3 is arranged with the feedback resistor 4b and the boot strap resistors 4a and 4c arranged generally in a plane parallel to the substrate. The feedback resistor 4b is arranged with one boot strap resistor arranged on each side. The bootstrap resistors are provided in reasonably close proximity on either side of the feedback resistor to reduce the fringing capacitance seen by the feedback resistor. As can be seen from FIG. 4, the fringing capacitance seen by the feedback resistor is now reduced considerably and is mostly due to the bootstrap resistors.

The bootstrap resistors are driven with the same AC signal as the feedback resistor which means that there is no voltage change across the fringing capacitance between the feedback resistor and the bootstrap resistor. As there is no voltage change across the fringing capacitance, the effective parasitic capacitance seen by the feedback resistor is reduced. In an ideal case the parasitic resistance is nulled, but in practise it is very much reduced as compared to the circuit of FIG. 1.

Thus there is capacitance $C_A$ between the area of the feedback resistor and the substrate 3. Similarly there is a capacitance $C_A$ between the areas of the boot strap resistors and the substrate 3. There is a small amount of capacitance between each of the bootstrap resistors and the feedback resistors. Each of the bootstrap resistors has a fringing capacitance $C_F$.

Figure 5:
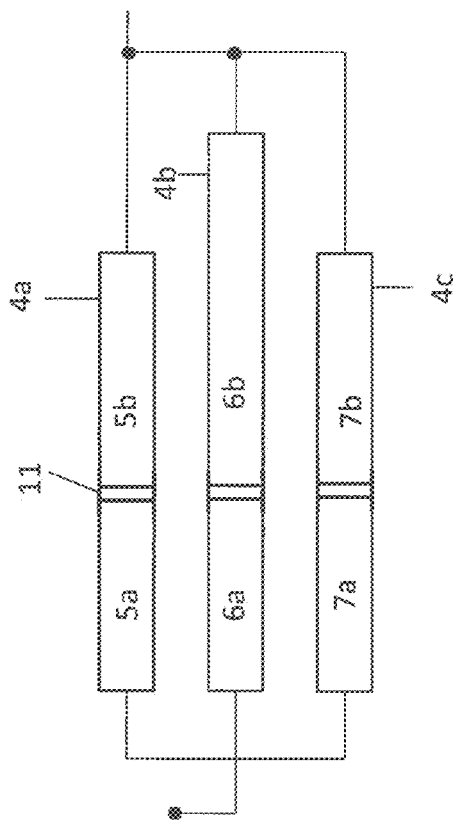
FIG. 5 shows a plan view of the resistors of FIG. 3, in an integrated circuit or die.

Reference is made to FIG. 5 which schematically shows a plan view of the resistors of FIGS. 3 and 4 as in the integrated circuit or die. It should be appreciated that the arrangement of FIG. 5 is not to scale. As can be seen, the resistors are provided as parallel elongate strips. The feedback resistor is arranged in-between the two bootstrap resistors. The gap between the feedback resistor and each of the bootstrap resistors may be the same. The strips may be rectangular in cross section with a width greater than the height in some embodiments. The width of the strip is parallel to the substrate and the height of the strip is perpendicular to the substrate. In some embodiments, the height may be greater than the width.

In some embodiments, the width and the height of each of the feedback and bootstrap resistors may be the same. In other embodiments, the feedback and boot strap resistors may have a different height and/or width.

In some embodiments, the boot strap resistors may be shorter than the feedback resistor to allow for the finite gain of the trans-impedance amplifier. The difference may be small with respect to the overall lengths of the resistors. The bootstrap resistors may act as dummy resistors improving the yield/manufacturer of long thin resistors.

Where a resistor is provided by two or more resistors, there will be one or more breaks in the elongate resistance shown in FIG. 5 to thereby provide the two or more resistors in the form of areas 11 of increased electrical conductivity. This may be achieved by connecting through a metal portion.

Figure 6:
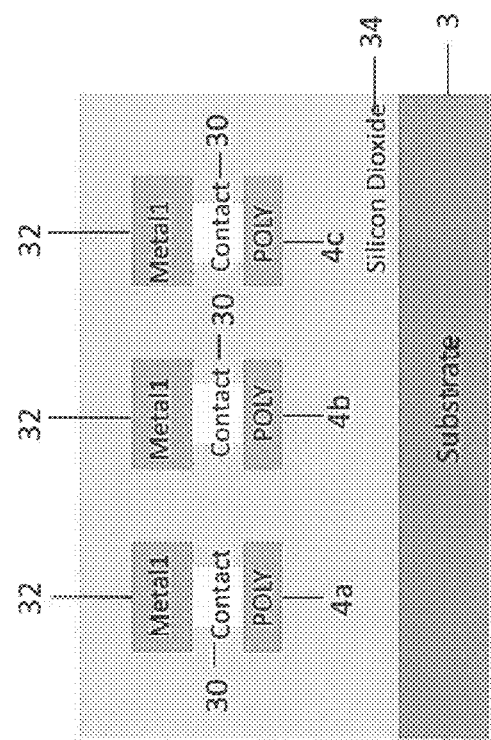
FIG. 6 shows a schematic cross section of the arrangement of FIG. 3, in an integrated circuit or die.

By way of example only, the feedback resistor may be of the order of 50 kohms. However this is by way of example only and in other embodiments, different values of the feedback resistor may be used. For example the resistor may have a value in the range 20 to 100 KOhms. Of course, some embodiments may have resistance values outside this range. Reference is made to FIG. 6 which shows a schematic cross section through the integrated circuit or die for the arrangement of FIGS. 3, 4 and 5. The cross-section shows a similar view to that of FIG. 4. The substrate 3 is shown, above which is shown a silicon dioxide layer 34. The silicon dioxide layer 34 has the polysilicon resistors 4a, 4b and 4c as discussed above. Above each of the polysilicon resistors is provided a contact 30 which provide contact between the respective resistor and a respective metal portion 32. The respective metal portions are provided in the same layer. In some embodiments, the thickness of the resistor may be similar or greater than its width. A thicker resistor may have greater Cf capacitance than Ca capacitance, in which case the bootstrapping gives an improved benefit.

Figure 7:
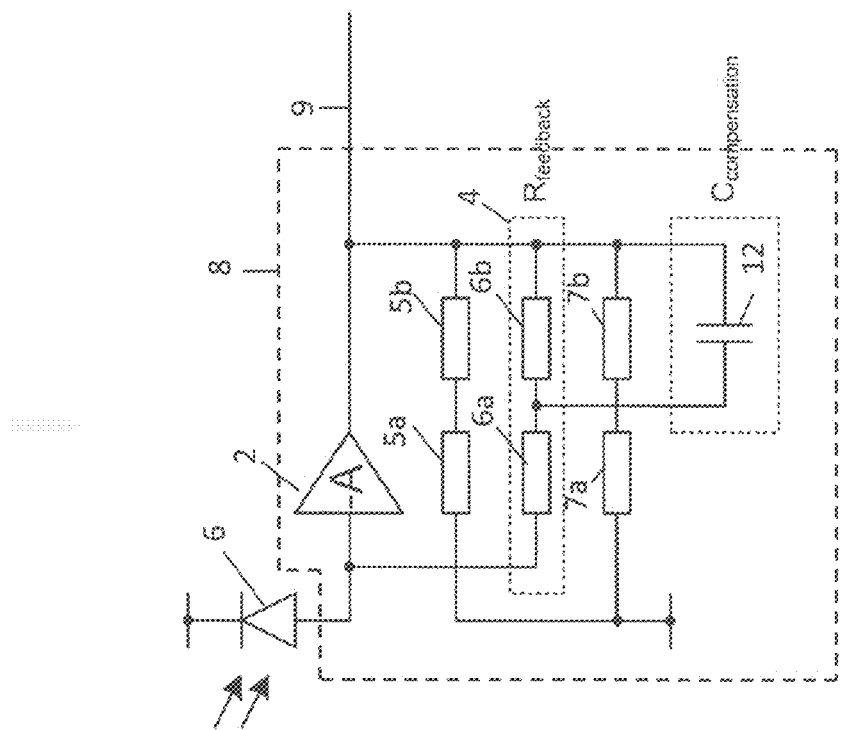
FIG. 7 shows a second embodiment of a trans-impedance amplifier circuit.

Reference is made to FIG. 7 which shows another embodiment. The circuit shown in FIG. 7 is generally the same as shown in FIG. 3. Those parts of the circuit which are the same will not be described again. In the arrangement of FIG. 7, a compensation capacitor is provided across one of the resistors, resistor 6b, of the feedback resistance 4.

In some embodiments, the bootstrap resistors will remove some of the parasitic capacitance with the substrate. However, there will still be some capacitance due to the capacitance area $C_A$. This parasitic capacitance may cause losses in the feedback resistance. This may be compensated in the closed loop (feedback loop) by the trans-impedance amplifier increasing the output drive at high frequencies. This increased output drive may result in the frequency response peaking and/or phase response distortion. The frequency response peaking and/or phase response distortion may decrease performance by letting through more noise and increasing jitter.

In some embodiments, the compensation capacitor 12 may effectively reduce the feedback resistance at high frequency compensating for the increased output drive of the trans-impedance amplifier. This may help in maintaining a flat or flatter frequency response.

In some embodiments, the compensation capacitance 12 should be relatively small so that compensation does not begin at too low a frequency. In some embodiments this may be small comparable to a parasitic capacitance.

The compensation capacitance 10 may need to be well controlled so as not to introduce part variation in the frequency response. Part to part variation may occur—due to tolerances in manufacturing of the small geometries in integrated circuits.

The compensation capacitance may be such that it does not increase the parasitic capacitance with the substrate.

The physical position of the capacitor with respect to the resistor may be such that the resistor is between the capacitor and the substrate reducing parasitic between the capacitor and the substrate. The amount of overlap in the capacitor's structure will control the amount of capacitance and hence the impedance formed by the parallel combination of the capacitor and the feedback resistor. Applying the compensation capacitance to only a part of the feedback resistor Rfb means that the compensation capacitance may be a larger value and therefore easier to control for part to part variation. For example the compensation may be provided along a third of the length of the feedback resistor.

Figure 8:
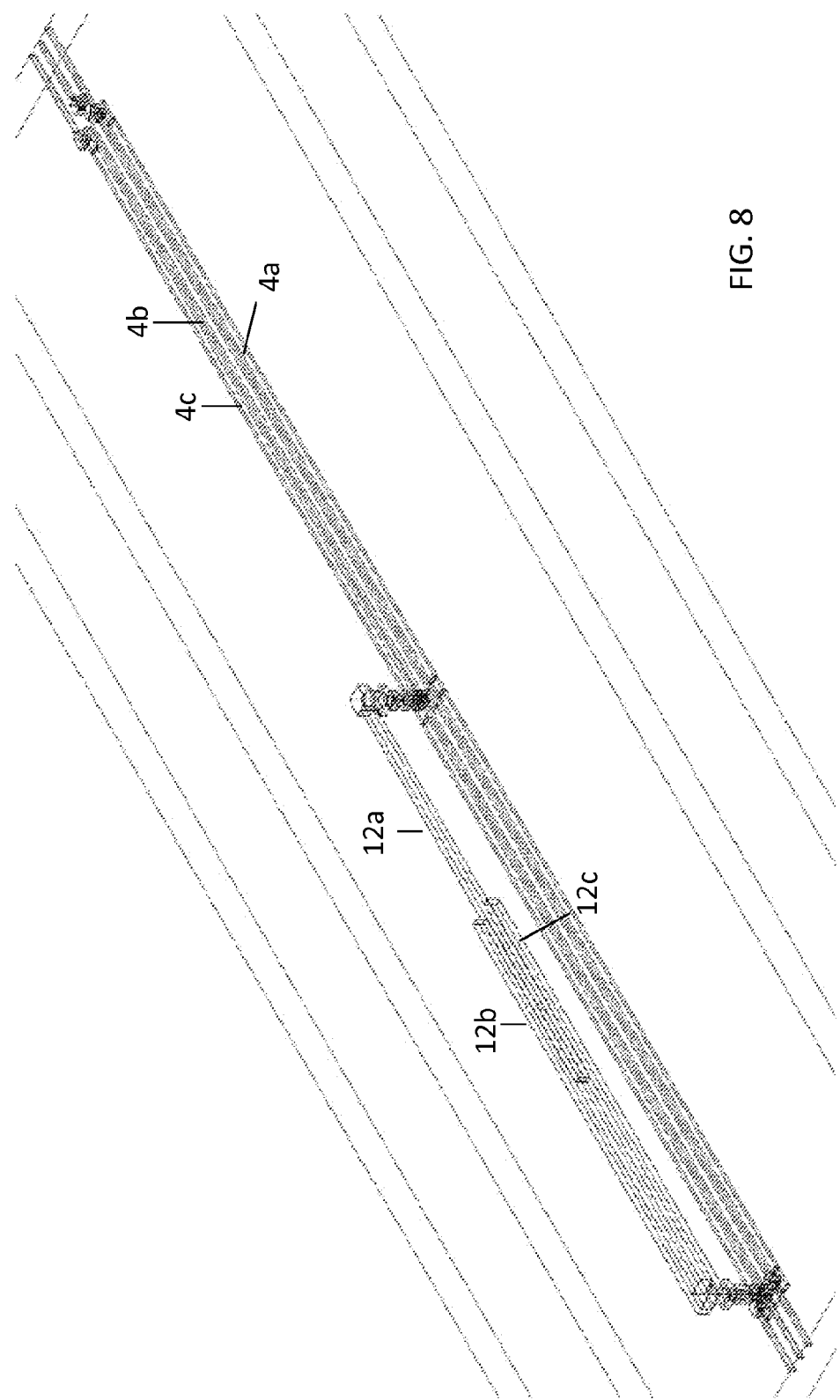
FIG. 8 shows a perspective view of the resistors and capacitor of FIG. 7, in an integrated circuit or die.

Reference is made to FIG. 8 which shows a perspective view of the physical arrangement in the integrated circuit or die. The capacitance 10, FIG. 7 may be provided in a relatively high level metal over the feedback resistor. (This is discussed in more detail with reference to FIG. 9). Generally, it is possible to control well the metal to metal spacing with in the same metal layer. As the compensation capacitance is implemented in a higher level metal, this reduces the parasitic capacitance with the substrate. In other words, there is a relatively large spacing between the substrate and the compensation capacitor. This may reduce parasitic capacitance.

In some embodiments providing the compensation capacitor over the top of the feedback resistor may reduce the parasitic capacitance to the substrate.

In some embodiments, the capacitance may be provided along part of the feedback resistor, as shown in FIG. 8. This may reduce sensitivity to the tolerance of the compensation capacitance. This is because the capacitor can be larger than if the capacitance is provided along the length of the feedback resistor. As shown in FIG. 8 the capacitor 12 is provided by a first elongate element 12a provided between parallel elongate elements 12b and 12c. There is a degree of overlap between the first elongate element and the parallel elongate elements will control the value of the capacitor. The parallel elongate elements are at the same voltage. The first elongate element is at a different voltage. The parallel elongate elements and the first elongate element are arranged in the same plane, and in a plane parallel to that containing the feedback resistor. The longitudinal axes of the parallel elongate elements and the first elongate element are parallel to one another and to the longitudinal axes of the resistors. The arrangement of FIG. 8 shows in fact two capacitors in parallel providing the capacitance of FIG. 7. The first capacitor is provided by one of the parallel elongate elements and the first elongate element. The other capacitor is provided by the other of the parallel elongate elements and the first elongate element. The capacitor elements are separated by a material which is dielectric. By way of example this dielectric material is Silicon Dioxide or the like.

Figure 9:
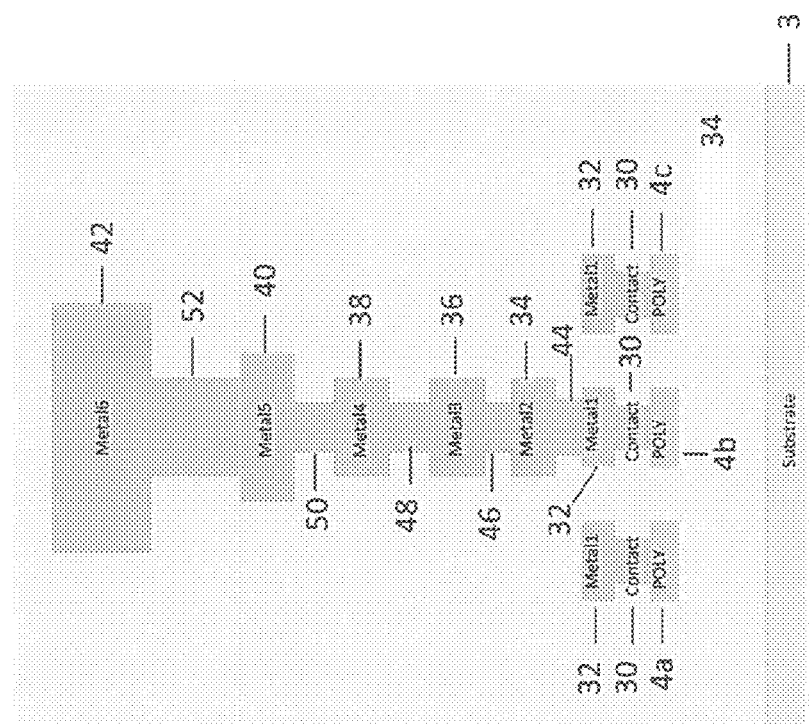
FIG. 9 shows a schematic cross section of the arrangement of FIG. 7, in an integrated circuit or die.

Reference is now made to FIG. 9 which shows a schematic cross-section through the integrated circuit or die of the arrangement of FIGS. 7 and 8. The arrangement shown is similar to that shown in FIG. 6 with additional metal layers above the feedback resistor. As can be seen, there are six metal layers, metal1 32, metal2 34, metal3 36, metal4 38, metal5 40 and metal6 42 which are provided in respective planes parallel to and increasingly spaced from the layer containing the feedback resistance. The metal layers will make contact with each other by respective contacts. Contact 44 couples the first metal layer (metal1) and the second metal layer (metal2). Contact 46 couples the second metal layer (metal2) and the third metal layer (metal3), contact 48 couples the third metal layer (metal 3) and the four metal layer (metal4), contact 50 couples the fourth metal layer (metal4) and the fifth metal layer (metal5), and contact 52 couples the fifth metal layer (metal5) and the sixth metal layer (metal6).

The capacitance may be provided by any one or more of the metal layers. In this example the capacitance is in the sixth metal layer. It should be appreciated that other embodiments may have more or less than seven layers.

In some embodiments, the photodiode may be replaced by any other suitable photo detector.

In some embodiments, the circuitry shown may be used in fibre optic applications. For example, the light source for the photo detector or photo diode may be from an optical fibre.

In some embodiments, the circuitry may be used in fibre-optic networks, for example for broadband networks or other data network application. In some embodiments, if the trans-impedance amplifier has an improved sensitivity, this means that the length of fibre-optic cable between relays can be increased or the output can be split to more destinations.

In some embodiments, the circuitry may be suitable for dealing with arrangements which have data rates in the range of 1-100 Gbps (Gigabit per second). However, this is by way of example only and other embodiments may deal with different data rates.

In some embodiments, the circuitry shown may be implemented using CMOS (complementary metal-oxide semiconductor) technology. In other embodiments a different technology may be used.

In some embodiments, making the resistor longer and thinner may improve performance. The width of the resistor with respect to its height may be smaller.

In some embodiments, the fringe capacitance may be reduced by two thirds as compared to the arrangement of FIG. 1

In some embodiments, the arrangement may improve the bandwidth power or the sensitivity.

It should be appreciated that some examples of materials for the integrated circuit or die have been described. It should be appreciated that this is by way of example only and in other embodiments, different materials may be used.

Figures 10A, 10B:
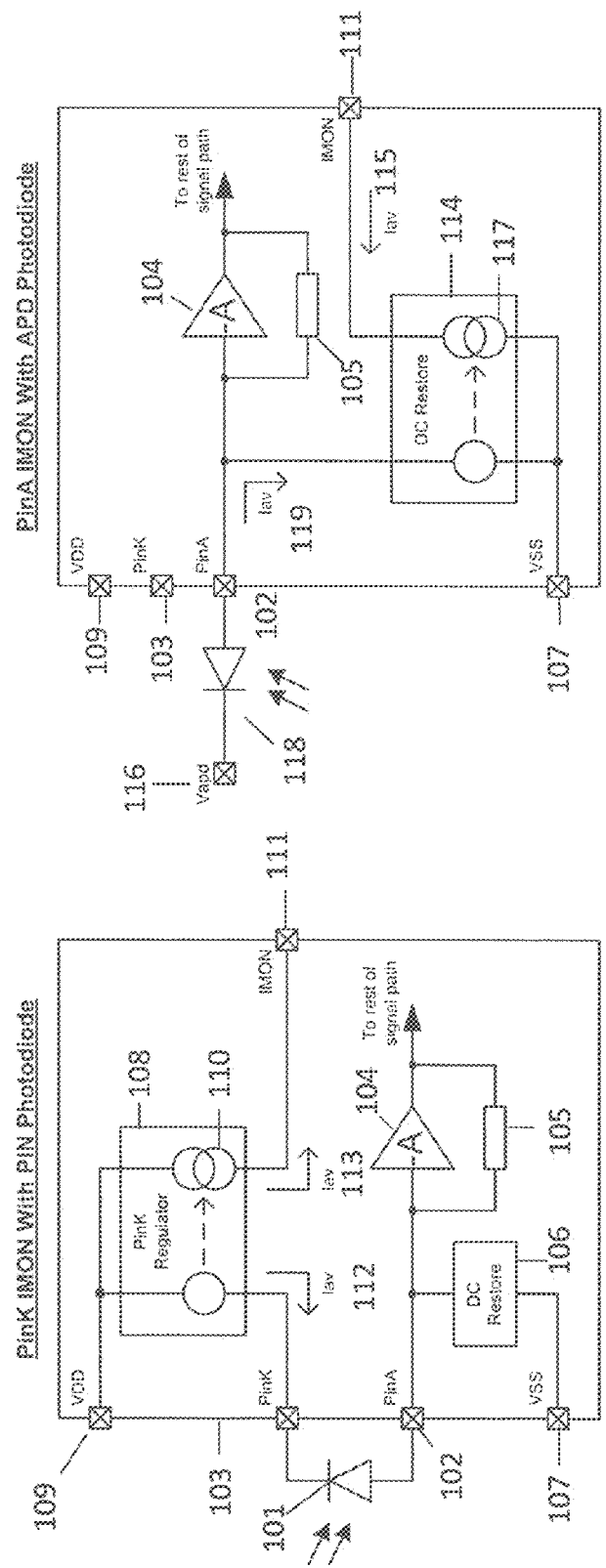
FIG. 10A schematically shows a trans-impedance amplifier circuit with a current monitor output suitable for PIN photodiodes.
FIG. 10B schematically shows a trans-impedance amplifier circuit with a current monitor output suitable for avalanche photodiodes (APD)

Reference is now made to FIG. 10A which shows a trans-impedance amplifier circuit having a photodiode 101 provided between two pins: PinA 102 and PinK 103. In the configuration of FIG. 10A, the anode of the photodiode 101 is coupled to PinA 102 whilst the cathode is coupled to PinK 103. PinA 102 is an input terminal for receiving current from the photodiode 101. An amplifier 104 is provided between PinA 102 and an output with a feedback resistor 105 between the input and the output of the amplifier 104. A DC restore circuit 106 is connected between PinA 102 and the negative power supply VSS 107. A voltage regulator 108 is provided between the positive supply rail VDD 109 and PinK 103. The voltage regulator 108 comprises a current mirror 110 which is connected to a current monitor output IMON 111. The average current through the photodiode 112 is provided by the voltage regulator 108 through PinK 103. Accordingly the current output by the current mirror 113 to the IMON output 111 is a mirror of the average photodiode current 112.

The current monitor output (IMON) is used to provide an average of the photodiode current. This current can be measured and used to provide an indication of average signal intensity. In some embodiments the IMON output may be monitored to detect performance issues. In one embodiment, a drop in the IMON output current may indicate that the photodiode is faulty. In another embodiment, a drop in the IMON output current could be detected and used to identify degradation in performance of a light source.

Reference is now made to FIG. 10B which shows a trans-impedance amplifier circuit with a current monitor output for an avalanche photodiode (APD). An APD may require a finely tuned bias voltage which may be applied from an external source. Accordingly an APD may not be suitable for connection between PinA and PinK. In the configuration of FIG. 10B, the anode of the APD 118 is provided to PinA 102 whilst the cathode is provided to an external bias voltage Vapd 116. An amplifier is provided between PinA 102 and an output with a feedback resistor 105 between the input and the output of the amplifier 104. A DC restore circuit 114 is provided between PinA 102 and the negative power supply VSS 107. The DC restore circuit 114 comprises a current mirror 117 which is output to a current monitor output IMON 111. The average current through the photodiode 119 flows through the DC Restore circuit as explained later. Accordingly the current output by the current mirror 115 to the IMON output 111 is a mirror of the average photodiode current 119.

Some embodiments may require a new pin to the ROSA (receiver optical subassembly) and/or may eliminate or reduce costly external circuitry and/or costly additional integrated features on the external IC that provides the bias to the photodiode The external bias voltage may be provided by an external package. By providing an IMON output 111, from only the PinA 102 connection the need for external circuitry to provide an IMON output is removed.

Figure 11:
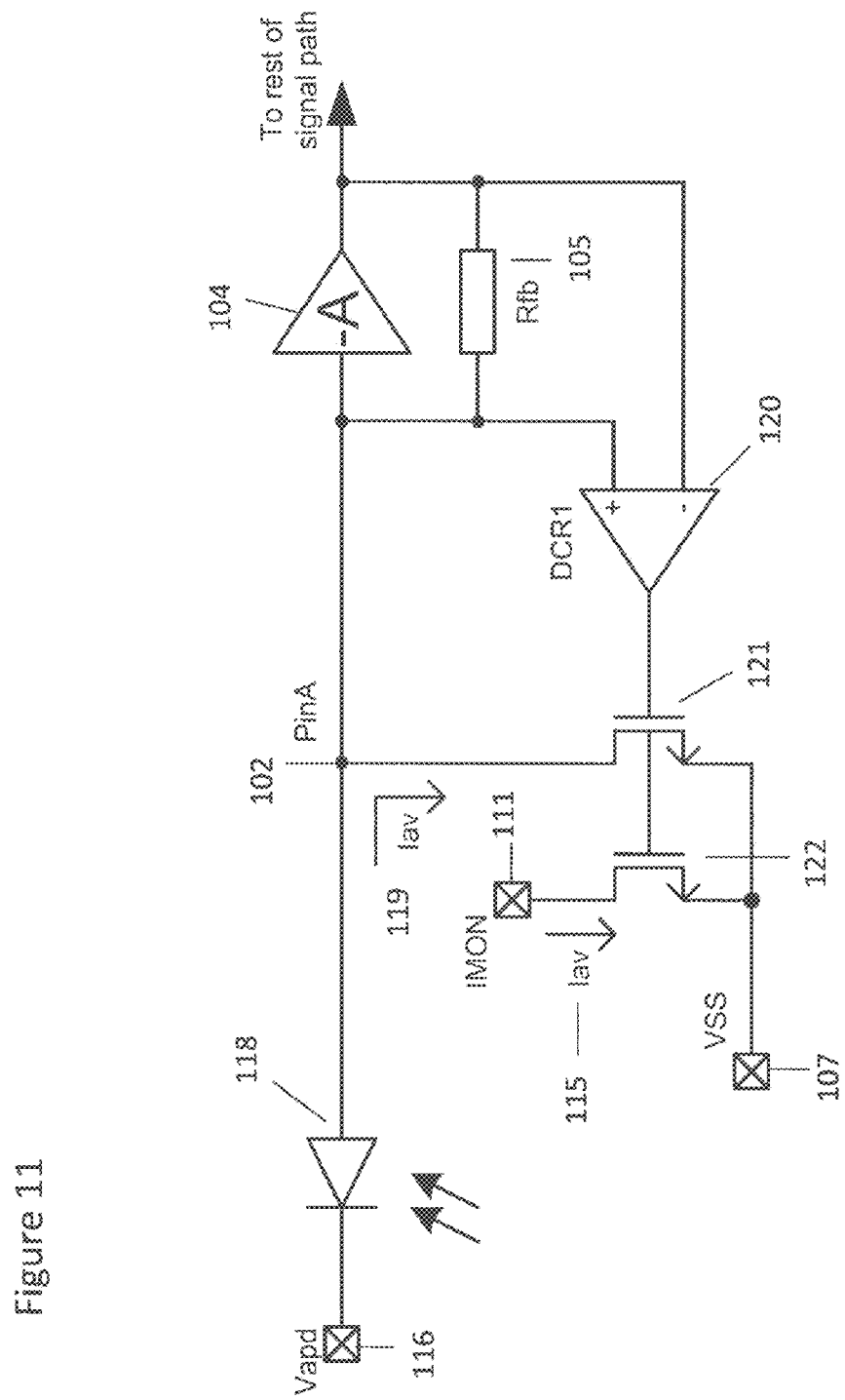
FIG. 11 schematically shows a trans-impedance amplifier circuit with DC recover loop providing a current monitor output.

Reference is now made to FIG. 11 which shows an embodiment of the trans-impedance amplifier of FIG. 10B. An APD 118 is provided having the anode coupled to PinA 102 and the cathode coupled to an external bias voltage Vapd 116. An amplifier is provided between PinA 102 and an output with a feedback resistor 105 between the input and the output of the amplifier 104. An operational amplifier 120 is provided with the inverting input coupled to the output of amplifier 104 and the non-inverting output coupled to the input of amplifier 104. The output of operational amplifier 120 is provided to the gates of transistors 121 and 122. The drain of transistor 121 is coupled to PinA 102 and the source is coupled to the negative supply rail VSS 107. The drain of transistor 122 is coupled to the IMON output 111 and the source is coupled to the negative supply rail VSS 107. Operational amplifier 120 is configured to control the DC voltage across feedback resistor 105 to be 0V by using transistor 121 to draw current 119 from the APD 118. Transistor 122 is configured to draw the same current 115 from the IMON output 111. Accordingly a current monitor output is provided without the use of PinK 103, FIG. 10A.

Figure 12:
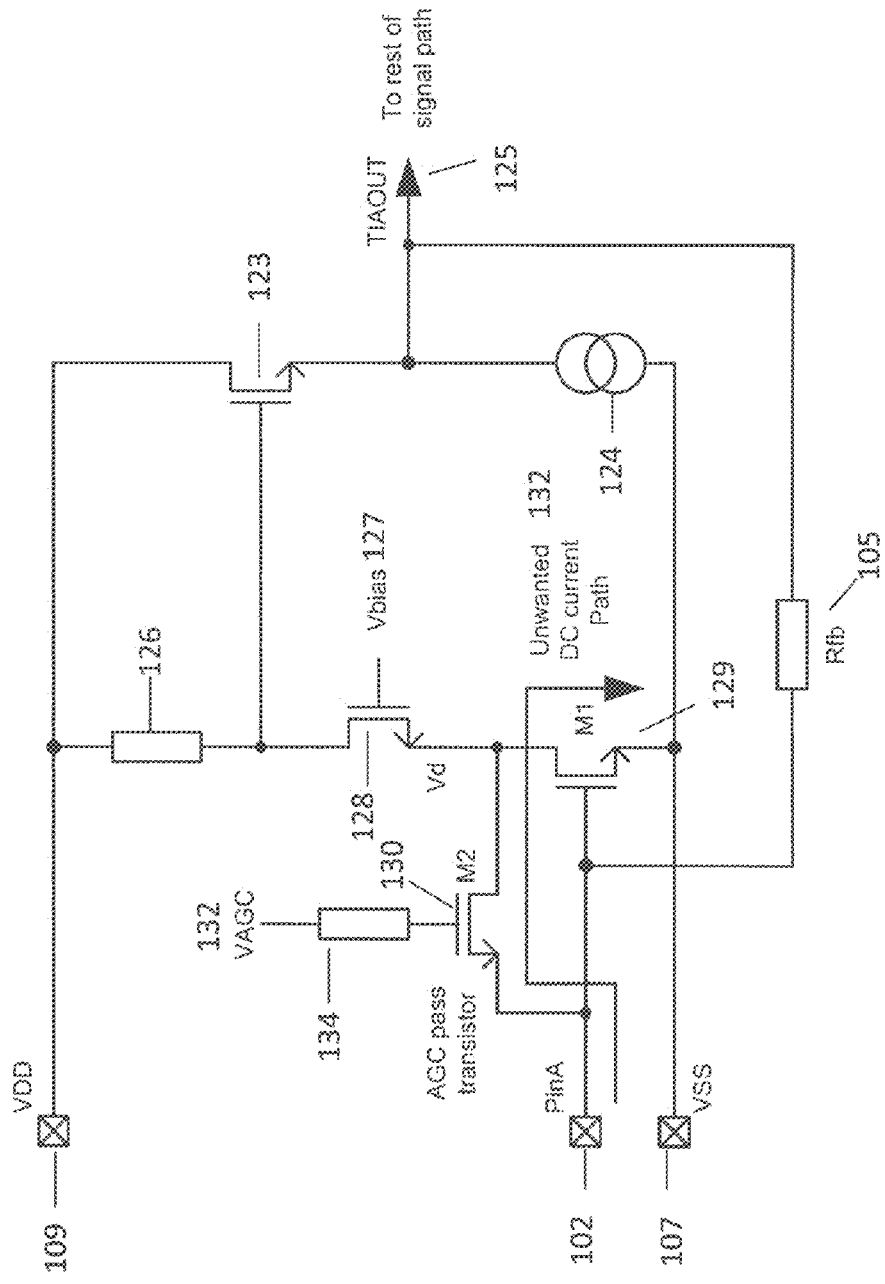
FIG. 12 schematically shows a trans-impedance amplifier circuit with automatic gain control.

Reference is made to FIG. 12 which shows a trans-impedance amplifier featuring automatic gain control. A transistor 123 is provided having a drain coupled to the positive supply rail VDD 109 and the source coupled to an output 125. A constant current source 124 is provided between the output 125 and the negative supply rail VSS 107. A resistor 126 is provided between the positive supply rail 109 and the gate of transistor 123. A bias transistor 128 is provided having the drain coupled to the gate of transistor 123 and the gate coupled to a bias voltage Vbias 127. An input transistor M1 129 is provided having a drain coupled to the source of bias transistor 128, a source coupled to the negative supply rail 107 and a gate coupled to PinA 102. A feedback resistor 105 is provided between the PinA 102 and the output 125. Automatic gain control transistor 130 is provided having a drain coupled to the drain of input transistor 129 and a source coupled to PinA 102. A resistor 134 is provided between an input automatic gain control voltage VAGC 132 and the gate automatic gain control transistor 130.

Automatic gain control is required to allow for a larger input range. It may be the case that the sensitivity of the photodiode allows for a much greater input range than the output range of the amplifier. Automatic gain control voltage VAGC132 can be used to attenuate the input current such that higher input currents do not saturate the output 125. A high voltage at input VAGC 132 turns on transistor 130 which opens a DC path from PinA through transistors 130 and 129 to the negative supply rail 107. Current passing through this path would be lost from the DC restore loop of FIG. 11 and accordingly would not be represented in a current monitor output.

Figure 13:
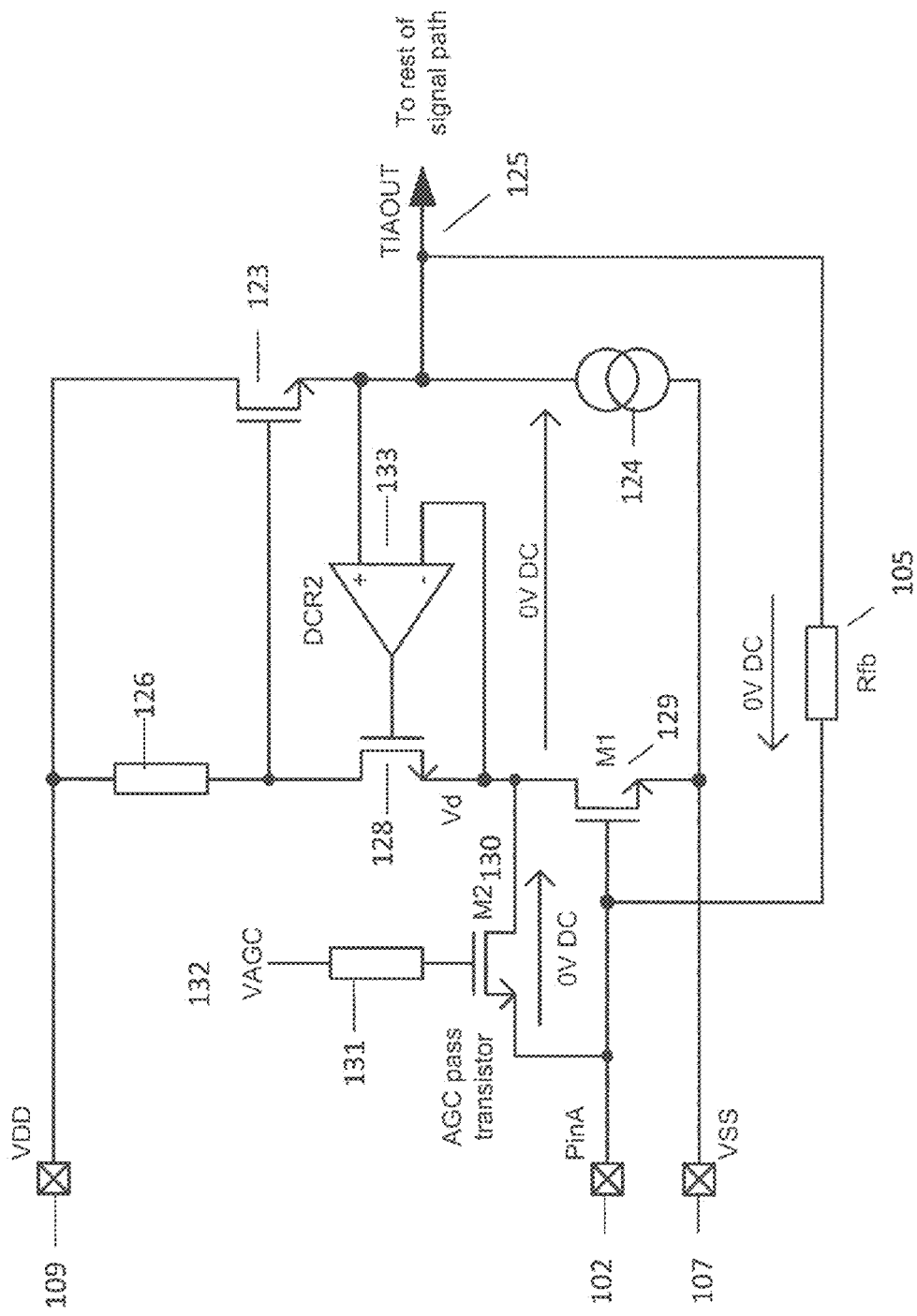
FIG. 13 schematically shows a trans-impedance amplifier circuit with a second DC recover loop.

Reference is now made to FIG. 13 which shows the circuit of FIG. 12 with the addition of a control loop. Operational amplifier 133 is provided having a non-inverting input coupled to the output 125, an inverting input coupled to the drain of input transistor 129 and an output coupled to the gate of bias transistor 128. The control loop provided by operational amplifier 133 controls the DC voltage between the inverting and non-inverting inputs to be 0V. In combination with the control loop of FIG. 11 (not shown in FIG. 13) which controls the DC voltage across the feedback resistor to be 0V, the DC voltage across automatic gain control transistor 130 is controlled to be 0V. Accordingly the DC current flowing through transistor 130 is also minimised increasing the accuracy of a current measurement output.

Figure 14:
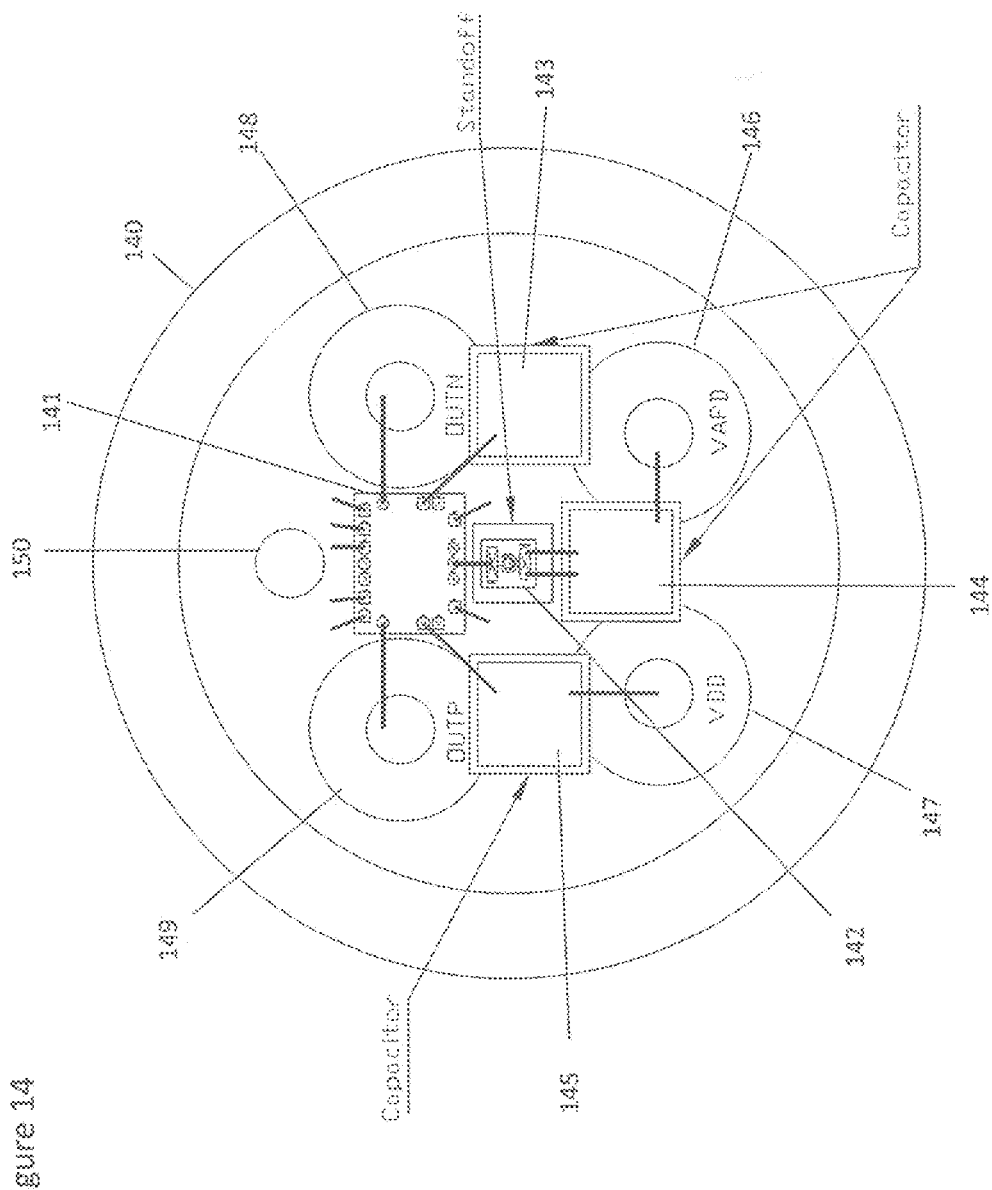
FIG. 14 shows a 5-pin package comprising a trans-impedance amplifier and a photodiode.

Reference is made to FIG. 14 which shows a 5-pin package for a photodiode with an on-board trans-impedance amplifier. A package 140 has five pins (3 outputs and 2 supplies) 146, 147, 148, 149 and 150. Trans-impedance amplifier circuitry 141 is provided on package 140. Capacitor 144 is provided between APD bias voltage pin 146 and the body of the package 140. The cathode of APD 142 is connected via the top plate of capacitor 144 to the APD bias voltage pin 146. Capacitor 143 is provided between the trans-impedance amplifier circuitry and the body of package 140. Capacitor 145 is provided between positive supply voltage pin 147 and the body of the package 140. The positive supply voltage of trans-impedance amplifier circuitry 141 is connected via the top plate of capacitor 145 to the positive supply voltage pin 147. Pins 148 and 149 are coupled to the outputs of trans-impedance amplifier circuitry. The anode of APD 142 is coupled to the input of trans-impedance amplifier circuitry 141. The body of package 140 is coupled to pin 150. This 5-pin package may have problems due to the connection between the VAPD input pin 146 and the capacitor 144 which make the circuit asymmetrical about the vertical centre line. In the embodiment of FIG. 14, the VAPD input 146 is closer to the OUTN output 148 than to the OUTP output 149. Accordingly feedback from the differential outputs will be unbalanced and won't cancel exactly causing a resultant feedback component to be injected into the trans-impedance amplifier through the APD. Unwanted feedback to the front end can reduce bandwidth and limit the operation of the device.

Figure 15:
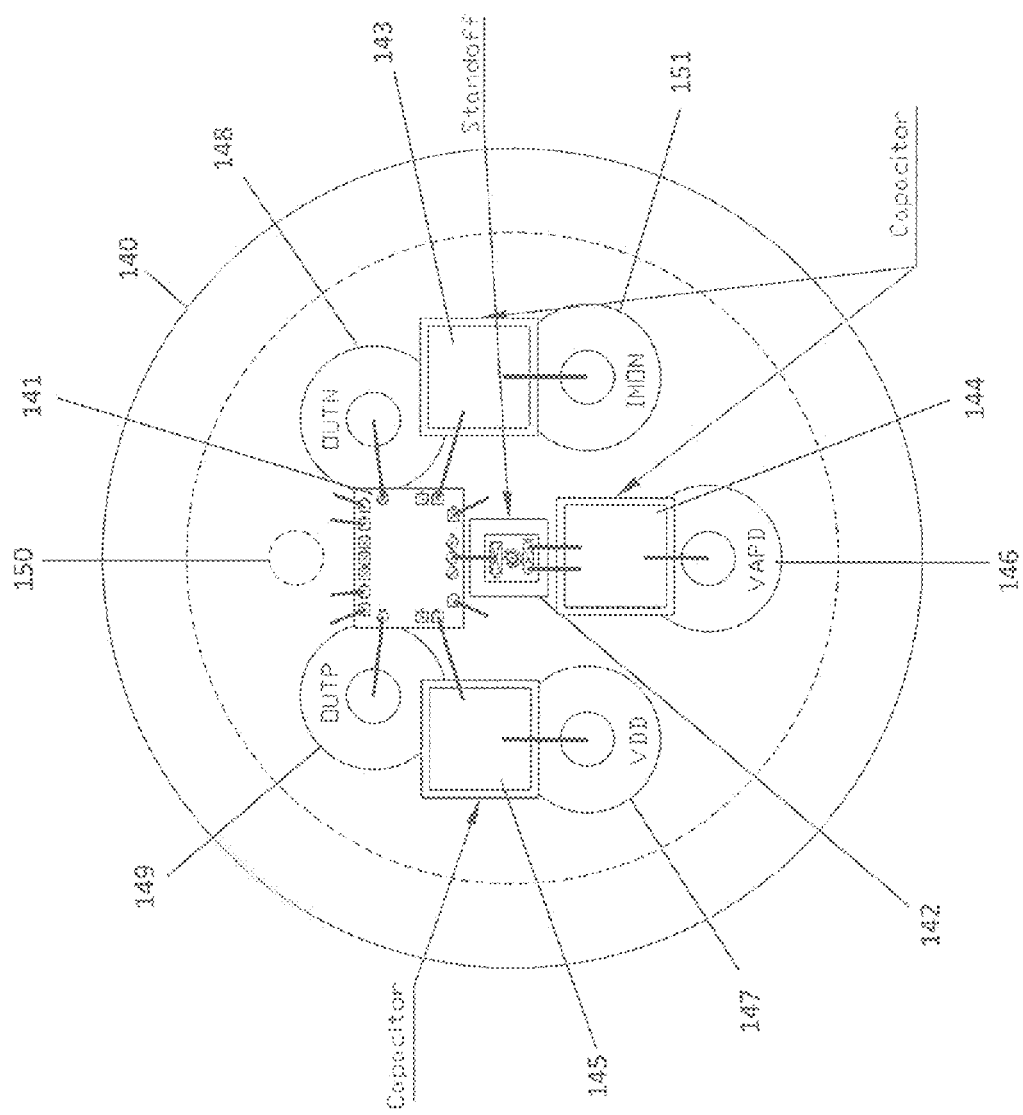
FIG. 15 shows a 6-pin package comprising a trans-impedance amplifier and a photodiode.

Reference is made to FIG. 15 which shows a 6-pin package for a photodiode with an on-board trans-impedance amplifier. A package 140 has six pins (3 outputs and 3 supplies) 146, 147, 148, 149, 150 and 151. Trans-impedance amplifier circuitry 141 is provided on package 140. Capacitor 144 is provided between APD bias voltage pin 146 and the body of the package 140. The cathode of APD 142 is connected via the top plate of capacitor 144 to the APD bias voltage pin 146. Capacitor 143 is provided between the trans-impedance amplifier circuitry and the body of package 140. Capacitor 145 is provided between positive supply voltage pin 147 and the positive supply voltage of trans-impedance amplifier circuitry 141. Pins 148 and 149 are coupled to outputs of trans-impedance amplifier circuitry. The anode of APD 142 is coupled to an input of trans-impedance amplifier circuitry 141. The body of package 140 is coupled to pin 150. Capacitor 143 is provided between a current measurement output of trans-impedance amplifier circuitry 141 and the body of package 140. The IMON pin 151 is connected via the top plate of capacitor 143 to the current measurement output of trans-impedance amplifier circuitry 141. This design has the advantage of being a symmetrical build. Accordingly any feedback from the OUTN 148 and OUTP 149 outputs can be configured to destructively interfere with each other and therefore reduce unwanted feedback.

It should be appreciated that an APD has been used by way of example only and other embodiments may comprise alternative photodiodes.

Reference is made to FIGS. 16A and 16B which show a normal method for protecting PinA from electrostatic discharge (ESD) strikes. A transistor 123 is provided having a drain coupled to the positive supply rail VDD 109 and the source coupled to an output 125. A constant current source 124 is provided between the output 125 and the negative supply rail VSS 107. A resistor 126 is provided between the positive supply rail 109 and the gate of transistor 123. A bias transistor 128 is provided having the drain coupled to the gate of transistor 123 and the gate coupled to a bias voltage Vbias 127. An input transistor M1 129 is provided having a drain coupled to the source of bias transistor 128, a source coupled to the negative supply rail 107 and a gate coupled to PinA 102. A feedback resistor 105 is provided between PinA 102 and output 125. Automatic gain control transistor 130 is provided having a drain coupled to the drain of input transistor 129 and a source coupled to PinA 102. A resistor 131 is provided between an input automatic gain control voltage VAGC 132 and the gate automatic gain control transistor 130. Diodes 161 and 163 are provided in series, in forward bias between PinA 102 and the negative supply rail 107. Diode 163 is provided in reverse bias between PinA 102 and the negative supply rail 107. Diodes 161, 162 and 163 are configured to insulate at low voltages and conduct at high voltages. Accordingly, a large spike voltage will be conducted to the power rails through the diodes rather than flow through the sensitive circuitry. FIG. 16A shows the current path during a positive ESD strike, flowing from PinA 102 through diodes 161 and 162 to the negative supply rail 107. FIG. 16B shows the current path during a negative ESD strike, flowing from the negative supply rail 107 through diode 163 to PinA 102. This method may be limited since each additional diode adds further parasitic load onto the very sensitive PinA node. Accordingly the 500V Human Body Model (HBM) required protection cannot be achieved.

Reference is made to FIG. 17 which shows the circuitry of FIGS. 16A and 16B with an additional diode 171 provided between PinA 102 and the gate of automatic gain control transistor 130 to improve positive ESD strike protection. During a positive ESD strike, automatic gain control transistor 130 is switched on. This introduces a new conductive path through transistors 130 and 129. Voltage Vd 172 may be held constant by a DC restore loop which is slow reacting and is therefore unaffected by the short duration of a ESD strike. Accordingly the additional current path does not allow the ESD strike to have an effect on any subsequent circuitry. This additional current path allows for larger current dissipation during a positive ESD strike than the embodiment of FIGS. 16A and 16B.

Therefore, although certain embodiments were described above by way of example, embodiments may be applied to any other suitable forms of systems than those illustrated and described herein. It is also noted that different combinations of different embodiments are possible. It is also noted herein that while the above describes exemplifying embodiments of the invention, there are several variations and modifications which may be made to the disclosed solution without departing from the spirit and scope of the present invention.

The invention claimed is:

1. A circuit manufactured in an integrated form comprising trans-impedance amplifier circuitry, the trans-impedance amplifier circuitry comprising:
   an amplifier;
   a feedback resistor, wherein the feedback resistor is provided within the integrated form circuit as a strip with the width of the strip parallel to a substrate and the height of the strip perpendicular to the substrate of the integrated form circuit and arranged between an output of the amplifier and an input of the amplifier;
   a first further resistor, wherein the first further resistor is provided within the integrated form circuit as a strip with the width of the first further resistor strip parallel to a substrate and the height of the first further resistor strip perpendicular to the substrate of the integrated form and is arranged within the integrated form circuit to be physically parallel to the feedback resistor, the first further resistor is further arranged within the integrated form circuit to a first side of the feedback resistor; and
   a second further resistor, wherein the second further resistor is provided within the integrated form circuit as a strip with the width of the second further resistor strip parallel to a substrate and the height of the second further resistor strip perpendicular to the substrate of the integrated form and is arranged within the integrated form circuit to be physically parallel to the feedback resistor, and wherein the second further resistor is further arranged within the integrated form circuit to a second side of the feedback resistor, wherein the first and second sides are on opposed sides of said feedback resistor within the integrated form circuit,
   wherein at least one of the feedback resistor, the first further resistor, and the second further resistor is elongate.

2. Circuitry as claimed in claim 1, wherein the feedback resistor is elongate and a longitudinal axis of the elongate feedback resistor is parallel to a respective longitudinal axis of the first further resistor and the second further resistor.

3. Circuitry as claimed in claim 1, wherein said feedback resistor, first further resistor, and second further resistor are provided in a same plane.

4. Circuitry as claimed in claim 1, wherein said feedback resistor is physically longer than said first and second further resistors.

5. Circuitry as claimed in claim 1, wherein a height of at least one of said feedback resistor, first further resistor, and second further resistor is greater than a respective width of the at least one of said feedback resistor, first further resistor, and second further resistor.

6. Circuitry as claimed in claim 1, wherein at least one of: said feedback resistor, first further resistor, and second further resistor is provided by a polysilicon layer.

7. Circuitry as claimed in claim 1, wherein said first and second further resistors are coupled between an output of said amplifier and a reference voltage level.

8. Circuitry as claimed in claim 1, comprising at least two elements providing a capacitance.

9. Circuitry as claimed in claim 8, wherein said at least two elements are elongate and a longitudinal axis of at least one of said feedback resistor, first further resistor, and second further resistor is parallel to a longitudinal axis of said at least two elongate elements.

10. Circuitry as claimed in claim 8, wherein said at least two elements are provided in a first plane spaced apart from a second plane in which of at least one of said feedback resistor, first further resistor, and second further resistor is provided.

11. Circuitry as claimed in claim 8, wherein said at least two elements are provided in a metal layer.

12. Circuitry as claimed in claim 8, wherein said at least two elements comprise a first elongate element extending between two second elongate elements.

13. Circuitry as claimed in claim 8, wherein said elongate elements are shorter than at least one of said feedback resistor, first further resistor, and second further resistor.

\* \* \* \* \*